(12) United States Patent
Ryan et al.

(10) Patent No.: US 11,662,369 B2
(45) Date of Patent: May 30, 2023

(54) POLYMERIC MOUNTING SUSPENSION FOR A SPLIT CORE CURRENT TRANSFORMER

(71) Applicant: Schweitzer Engineering Laboratories, Inc., Pullman, WA (US)

(72) Inventors: Eric Ryan, Spokane, WA (US); Mark A. Thomas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/450,480

(22) Filed: Oct. 11, 2021

(65) Prior Publication Data

US 2023/0110022 A1    Apr. 13, 2023

(51) Int. Cl.
*G01R 15/18* (2006.01)
*H01F 38/30* (2006.01)

(52) U.S. Cl.
CPC .......... *G01R 15/186* (2013.01); *H01F 38/30* (2013.01); *H01F 2038/305* (2013.01)

(58) Field of Classification Search
None
See application file for complete search history.

(56) References Cited

U.S. PATENT DOCUMENTS

| | | |
|---|---|---|
| 3,453,726 A | 7/1969 | Roen |
| 3,465,273 A | 9/1969 | Brock |
| 4,456,873 A | 6/1984 | Schweitzer |
| 4,635,055 A | 1/1987 | Fernandes |
| 4,782,582 A | 11/1988 | Venezia |
| 5,165,162 A | 11/1992 | Charles |
| 5,341,088 A * | 8/1994 | Davis ................. H02J 13/00034 324/105 |
| 5,426,360 A | 6/1995 | Maraio |
| 5,483,215 A | 1/1996 | Mies |
| 5,537,089 A | 7/1996 | Greif |
| 5,550,476 A | 8/1996 | Lau |
| 5,565,783 A | 10/1996 | Lau |
| 5,656,931 A | 8/1997 | Lau |
| 5,729,125 A | 3/1998 | Schweitzer |
| 5,889,399 A | 3/1999 | Schweitzer |
| 5,990,674 A | 11/1999 | Schweitzer |
| 6,002,260 A | 12/1999 | Lau |
| 7,227,441 B2 | 6/2007 | Skendzic |
| 7,312,686 B2 | 12/2007 | Bruno |
| 7,450,000 B2 | 11/2008 | Gidge |
| 7,474,192 B2 | 1/2009 | Skendzic |

(Continued)

FOREIGN PATENT DOCUMENTS

CN    202473586 U  * 10/2012
WO    2014072063      5/2014

(Continued)

*Primary Examiner* — Patrick Assouad
*Assistant Examiner* — Haidong Zhang
(74) *Attorney, Agent, or Firm* — Bradley W. Schield; Richard M. Edge

(57) ABSTRACT

A split core current transformer (CT) includes a first CT core half and a first housing that houses the first CT core half. The split core CT includes a second core half and a housing that houses the second CT core half. The split core CT includes a first set of bushings configured to flexibly couple the first insulative body to the first housing to maintain contact between faces of the first CT core half and faces of the second CT core half.

19 Claims, 5 Drawing Sheets

(56) References Cited

U.S. PATENT DOCUMENTS

| | | |
|---|---|---|
| 7,626,794 B2 | 12/2009 | Swartzendruber |
| 7,795,994 B2 | 11/2010 | Radtke |
| 7,930,141 B2 | 4/2011 | Banting |
| 8,536,857 B2 | 9/2013 | Nero |
| 8,738,318 B2 | 5/2014 | Spillane |
| 9,182,429 B2 | 11/2015 | Saxby |
| 9,229,036 B2 | 1/2016 | Kast |
| 9,424,975 B2 | 8/2016 | Cook |
| 9,448,257 B2 | 9/2016 | Saxby |
| 9,838,896 B1 | 12/2017 | Barnickel |
| 9,915,680 B2 | 3/2018 | Khoshnood |
| 9,954,354 B2 | 4/2018 | Baker |
| 9,984,818 B2 | 5/2018 | Rumrill |
| 10,971,295 B2 | 4/2021 | Thomas |
| 11,152,152 B2 | 10/2021 | Thomas |
| 2005/0237146 A1 | 10/2005 | Hirzel |
| 2006/0279910 A1 | 12/2006 | Gunn |
| 2008/0077336 A1 | 3/2008 | Fernandes |
| 2009/0115403 A1 | 5/2009 | Bernklau |
| 2009/0309754 A1 | 12/2009 | Bou |
| 2010/0084920 A1 | 4/2010 | Banting |
| 2010/0085036 A1 | 4/2010 | Banting |
| 2011/0025444 A1 | 2/2011 | Sugiyama |
| 2020/0176169 A1* | 6/2020 | Thomas ................. H01F 27/28 |
| 2020/0335276 A1 | 10/2020 | Na |

FOREIGN PATENT DOCUMENTS

| | | |
|---|---|---|
| WO | 2015136910 | 9/2015 |
| WO | 2015157296 | 10/2015 |

\* cited by examiner

POLYMERIC MOUNTING SUSPENSION FOR A SPLIT CORE CURRENT TRANSFORMER

TECHNICAL FIELD

The present disclosure generally relates to current transformers for power systems, and, more particularly, to ensuring contact faces of magnetic cores of a split core current transformer.

DRAWINGS

These and other features, aspects, and advantages of the present disclosure will become better understood when the following detail description is read with reference to the accompanying drawings in which like characters represent like parts throughout the drawings, wherein.

DETAILED DESCRIPTION

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers (CBs), disconnects, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

Current transformers (CTs) may be used by IEDs to detect current and/or harvest power from conductors, such as power lines, of an electric power system. The CT may include windings and a ferromagnetic toroidal core. The current on the conductor may create a magnetic field in the toroidal core that induces current in the windings proportional to the current on the conductor. The IED may measure the current on the conductor using the CT as well as operate using power harvested from the induced current. By monitoring current on various conductors of electric power delivery systems via CTs, the power delivery system may deliver power in a more reliable manner.

To couple the CT to a conductor, the core may be split into two portions, or halves. The first core half may be contained in a first housing and the second core half may be contained in a second housing. In some embodiments, the housings may be made of plastic or another insulative material to protect and secure the electric and magnetic components within the CT. The first housing and the second housing may be rotatably coupled such that faces of the first core half and faces of the second core half contact each other to allow magnetic flux to flow through the toroidal core when in the closed position.

However, the CT may not operate effectively if there is insufficient contact area between the faces of each half of the core when in the closed position. For example, the halves may fall out of alignment due to tolerances, movement, or wear and tear of the CT. If the halves are not aligned, there may be insufficient contact area between the faces which may cause the magnetic core to not allow enough magnetic flux to flow for the CT to be used in obtaining current measurements and/or harvesting power. As explained below, bushings may be used between the housing and the magnetic core to apply forces that cause the faces to maintain contact with each other.

Figure 1:
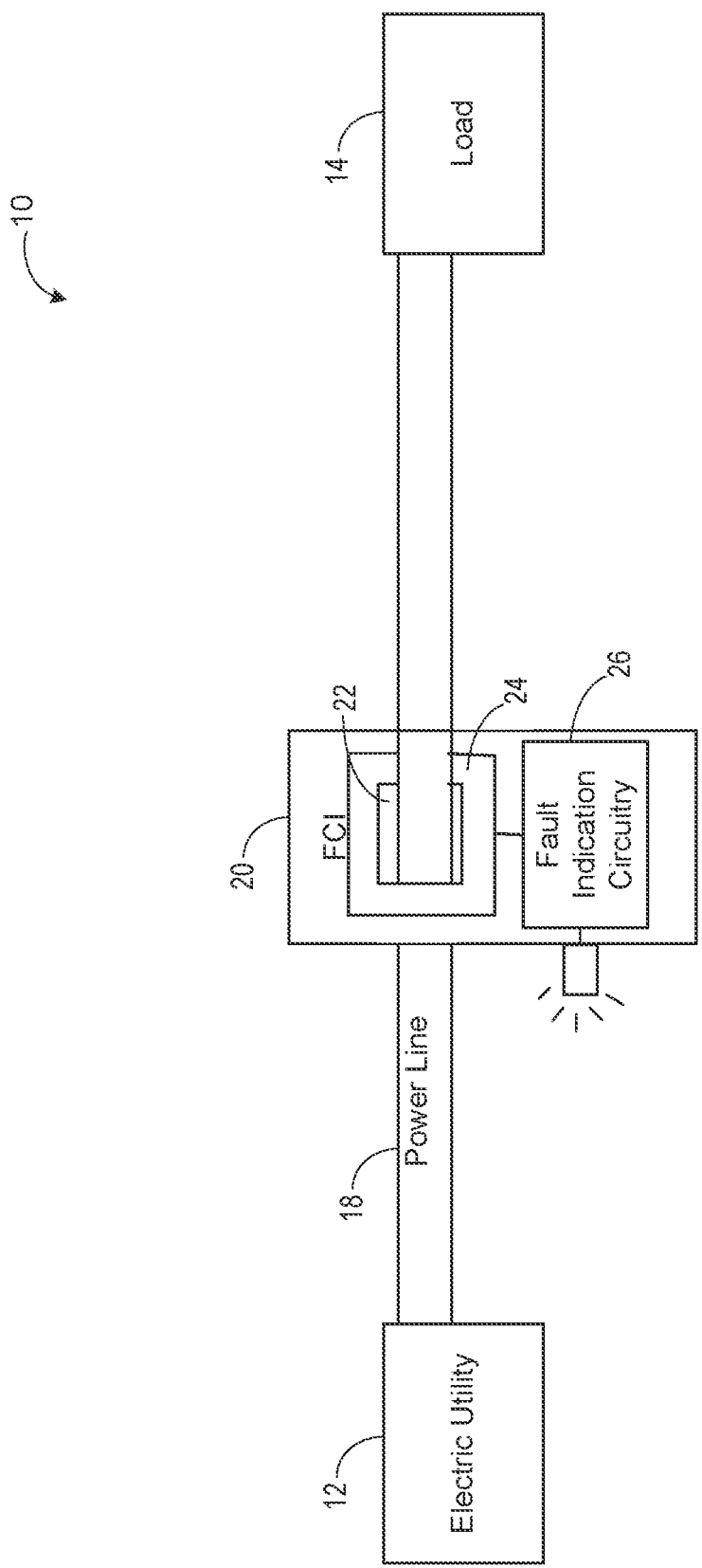
FIG. 1 is a block diagram of an electric power delivery system having a faulted circuit indicator (FCI) that uses a current transformer (CT) to measure current and/or to harvest power from a power line, in accordance with an embodiment.

FIG. 1 illustrates a block diagram of an electric power delivery system 10 having a source, such as an electric utility 12 that generates power to deliver electrical energy to a load 14 via one or more conductors, such as an overhead power line 18. The power line 18 may be any suitable transmission and/or distribution power line.

The electric power delivery system 10 may include a faulted circuit indicator (FCI) 20 having a CT 24 that encloses a portion of power line 18 via an opening 22 and secures the FCI 20 to the portion of the power line 18. The CT 24 may have coiled wire around a magnetic core to inductively measure alternating current (AC) through the power line 18. The FCI 20 may include fault detection circuitry 26 that receives a signal from the CT 24 and monitors the power line 18 for events. Note that any suitable electric power delivery system may be used in accordance with embodiments described herein and may include any suitable configuration of utilities, loads, transformers, power lines, and other various electrical components.

The fault detection circuitry 26 may be embodied as a general purpose integrated circuit, an application specific integrated circuit (ASIC), a field programmable gate array (FPGA), and/or other programmable logic devices. In some embodiments, the fault detection circuitry 26 may include one or more processor(s), such as a microprocessor, operatively coupled to a non-transitory computer-readable storage medium, such as memory. The memory may be a repository of one or more executable instructions (e.g., code) to implement any of the processes described herein. The fault detection circuitry 26 may include power harvesting circuitry to harvest power from the received current of the CT 24. The harvested power may be used to power operation of the FCI 20.

The CT 24 may provide a current signal to the fault detection circuitry 26 indicating the current on the power line 18. The fault detection circuitry 26 may then detect an event, such as an overcurrent event or an undercurrent event, on the power line 18. For example, the fault detection circuitry 26 may compare the received current from the CT 24 and compare the current to a threshold current. When the received current exceeds the threshold current, the fault detection circuitry 26 may provide an indication (e.g., via a light emitting diode (LED), via a transceiver, etc.) of the event to allow operators to locate and assess the cause of the event.

While an FCI is used as an example, CTs may be used in a wide variety of applications to detect current and/or to harvest power for various IEDs IEDs may refer to any microprocessor-based device that monitors, controls, automates, and/or protects monitored equipment in the electric power delivery system 10. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, digital sample publishing units, merging units, and the like. The term IED may be used to describe an individual IED or a system comprising multiple IEDs.

Figure 2:
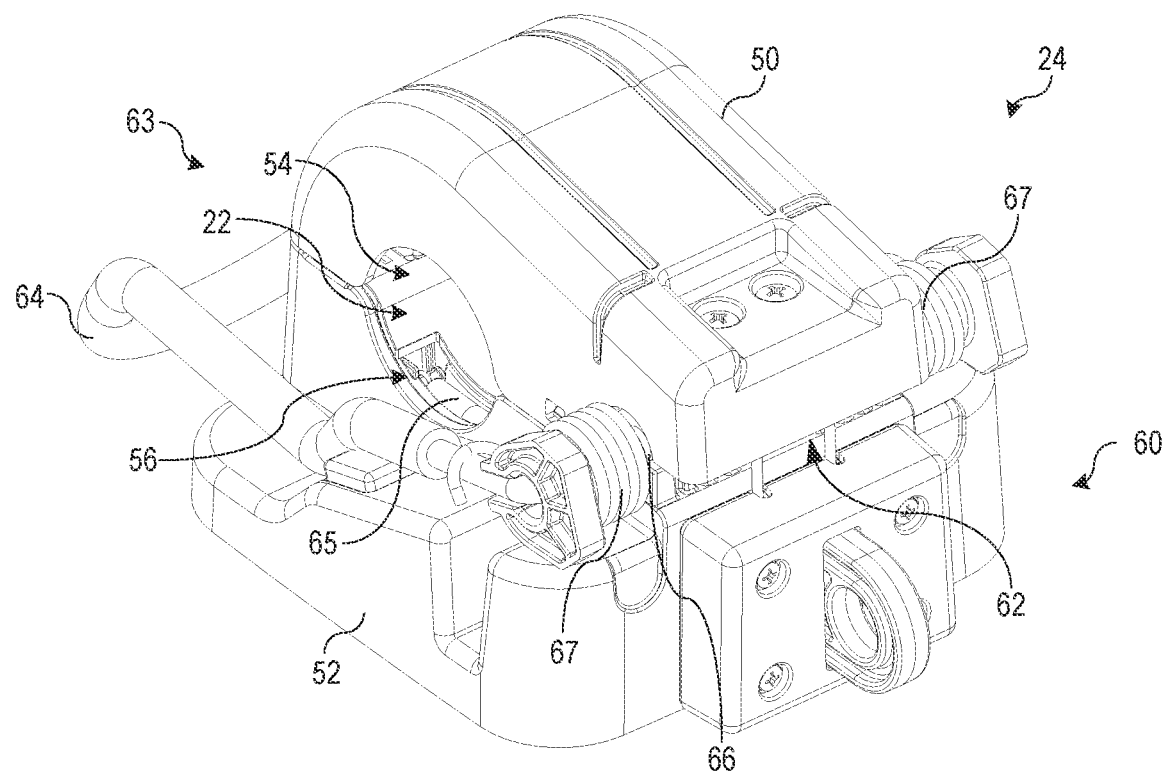
FIG. 2 is a perspective view of the CT of FIG. 1, in accordance with an embodiment.

FIG. 2 illustrates a perspective view of an embodiment of a CT 24 that may be used in the FCI 20. In the illustrated embodiment, the CT 24 includes a first CT half 50 and a second CT half 52. While in the closed position, as shown in FIG. 2, the first CT half 50 and the second CT half 52 form an annulus having an opening 22 therebetween to enclose a portion of the power line 18. That is, the CT half 52 includes a first portion 54 (e.g., first semi-cylindrical opening) of the opening 22 and the CT half 54 includes a second portion 56 (e.g., second semi-cylindrical opening) of the opening 22. The first portion 54 and the second portion 56 are contoured to form the opening 22 (e.g., cylindrical opening) to receive a conductor, such as the power line 18. The first CT half 50 and the second CT half 52 may be rotationally coupled to each other on a first end 60 of the FCI 20 via a hinged connection 62. In other embodiments, the CT half 50 and the second CT half 52 may be linearly coupled or coupled in any other suitable manner. The hinged connection 62 may align a second end 63 of the first housing to the second end 63 of the second housing 52 to position the windings annularly and proximate to the power line 18.

In the illustrated embodiment, the FCI 20 includes a clamp bar 64 that guides the power line 18 into the FCI 20 as the power line 18 is inserted into the opening 22 when in the open position. The FCI 20 has a torsion spring 66 that biases the first housing 50 and the second housing 52 towards each other to the closed position. That is, forces from the torsion spring 66 may maintain the first housing 50 and the second housing 52 in the closed position. Further, a clamp spring 67 or another spring may bias the clamp bar 64 to the closed position. To install the CT 24 to the power line 18, the CT 24 may be propped open with a prop 65. The prop may then be removed to allow the torsion spring 66 close the CT 24 around the power line 18 once the CT 24 is in place. While the clamp bar 64 and the clamp spring 67 are used in the illustrated embodiment, note that any suitable method of opening and closing the FCI 20 around the power line 18 may be used.

Figure 3:
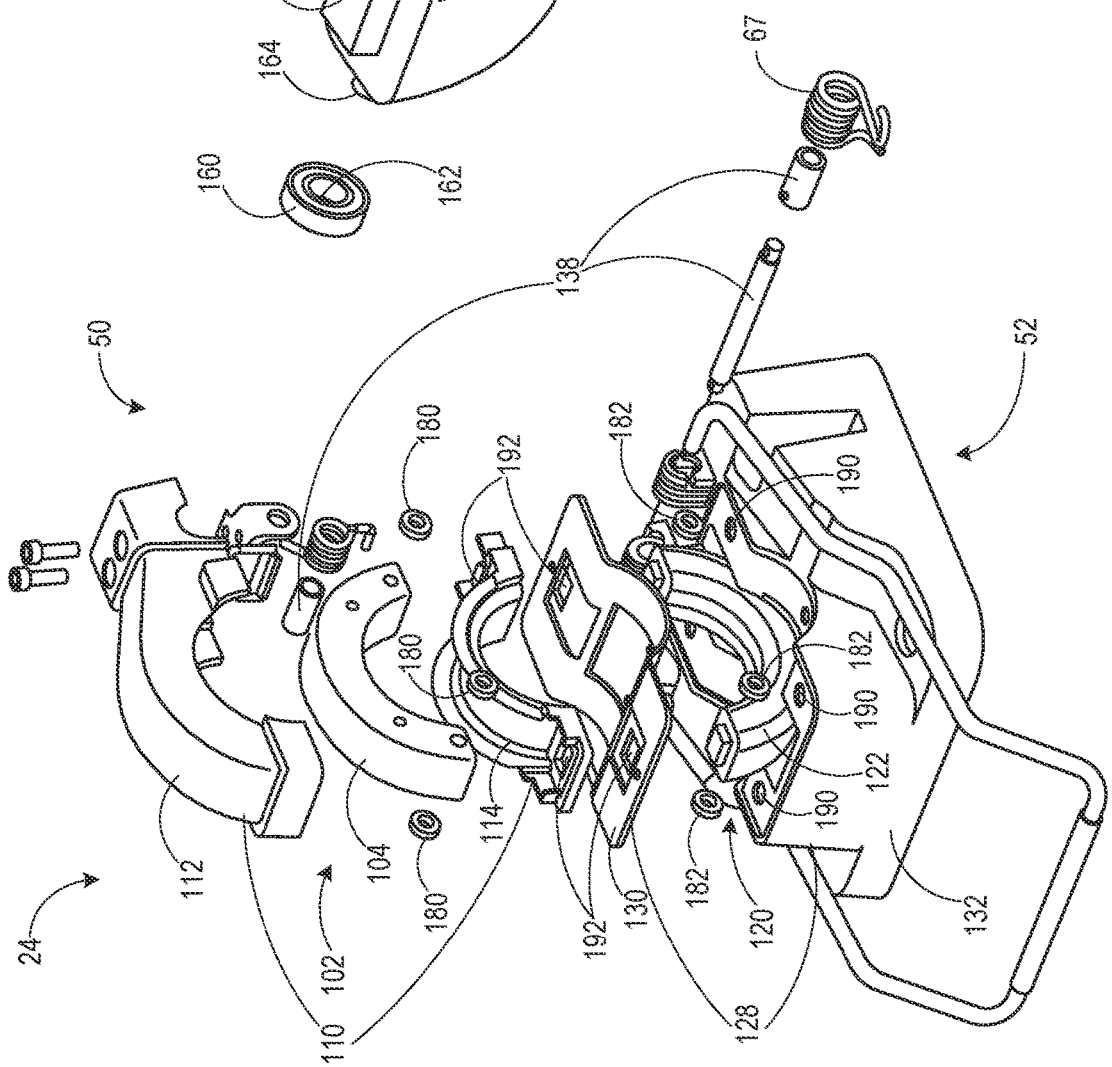
FIG. 3 is an exploded view of the CT of FIG. 1, in accordance with an embodiment.

FIG. 3 is an exploded view of the CT 24. The first CT half 50 includes a first CT core half 102 that has an insulative housing 104 that is formed over a first magnetic core half with a first set of windings wrapped around the first magnetic core half. The first CT half 50 includes a first housing 110 that has an upper body 112 and a lower body 114 to secure the first CT core half 102 within them CT 24. The upper body 112 and the lower body 114 are contoured to match the contour of the first magnetic core half to secure the first magnetic core half in place within the CT 24 and to allow the power line to pass between the first CT half 50 and the second CT half 52.

The second CT half 52 includes a second CT core half 120 that has a second insulative housing 122 that is formed over a second magnetic core half and a second set of windings wrapped around the second magnetic core half. The second CT half 52 includes a second housing 128 that has an upper body 130 and a lower body 132 contoured to match the contour of the second magnetic core half to secure the second magnetic core half in place within the CT 24.

The first insulative housing 104 and the second insulative housing 122 each secure the respective magnetic core halves and the sets of windings in place within the insulative housings to protect the windings and cores from contact, jostling, or movement of the CT 24. The first insulative housing 104 and the second insulative housing 122 may be formed over the respective magnetic core halves and respective sets of windings using an overmold tool. The core half and the set of windings may be inserted into the overmold tool for molding, such as injection molding. The first housing 110 and the second housing 128 may be made of an insulative material (e.g., plastic, rubber, etc.) and secure the components (e.g., the electronics, the core halves 102 and 104, connecting wiring, etc.) of the CT together for operation. The first housing 110 and the second housing 128 may be rotatably coupled via pin(s) 138 to allow the first CT core half 102 to rotate between an open position and a closed position with respect to the second CT core half 120.

Figure 4:
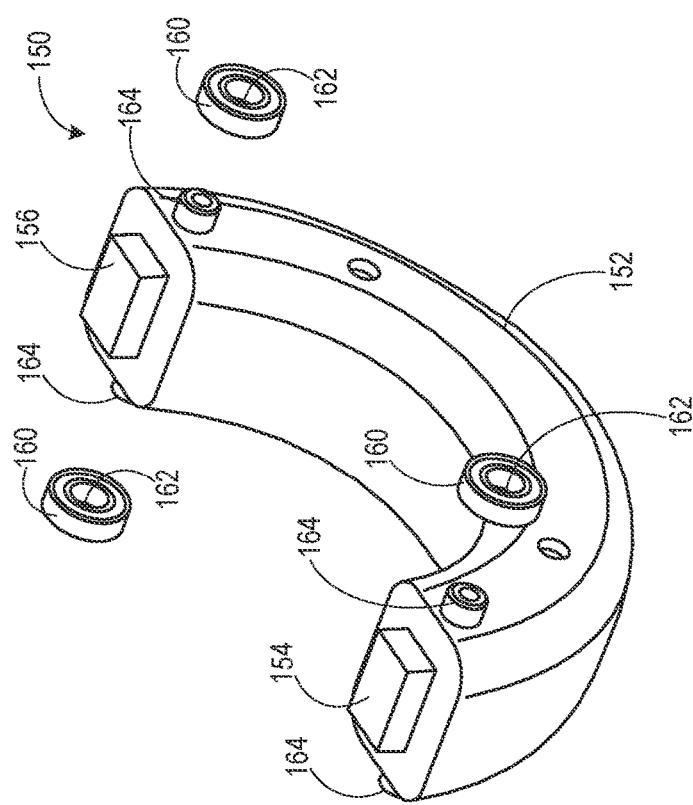
FIG. 4 is an exploded view of a CT core half of the CT of FIG. 1, in accordance with an embodiment.

FIG. 4 is an exploded view of a CT core half 150, such as the first CT core half 102 and the second CT core half 120 of FIG. 3. As illustrated, the CT core half 150 includes a magnetic core half within the insulative housing 152. The magnetic core half may include faces 154 and 156 on each end of the semi-annular body that protrude from the ends of the insulated housing 152 to contact corresponding faces on the other magnetic core half to allow magnetic flux to flow throughout the connected magnetic core.

As mentioned above, the faces 154 and 156 may become misaligned, improperly angled, or otherwise may not have sufficient contact with the corresponding other faces on the other core half due to tolerances of the CT 24, movement, among other reasons. A mechanical mounting suspension system may be used to ensure sufficient contact between the faces 154 and 156 of the core half 150 and corresponding faces of the other core half. The mounting suspension of the CT 24 may include a set of bushings 160 that flexibly couple the first insulative body to the first housing and the second insulative body to the second housing. The mounting suspension may include mounting features, or protrusions 164 that support the bushings 160. The set of bushings may include an opening 162 that allows the bushings 160 to be inserted onto the corresponding protrusions 164 of the insulative housing 152 to support the bushing upon insertion into the CT. The shape of the protrusions 164 may match the opening 162 of the bushing 160 to secure the bushing 160 to the insulative housing 152.

Returning to FIG. 3, the CT 24 may include a first set of bushings 180 that flexibly couple the first CT core half 102 to the first housing (e.g., upper body 112 and lower body 114, and the CT 24 may include a second set of bushings 182 that flexibly couple the second CT core half 120 to the second housing (e.g., upper body 130 and lower body 132). The bushings may be made of polymeric material with an amount of elasticity, such as rubber, plastics, and the like, that bend and/or flex to allow movement of the CT core halves 102 and 120 within the first and second housing. Because the clamp spring 67 biases the faces of CT core halves 102 and 120 towards each other and the first set of bushings 180 and the second set of bushings 182 allow for flexing between the CT core halves 102 and 120 and the corresponding housings 110 and 128, misalignment between the faces of the first core half 102 and the second core half 120 may be reduced or eliminated. That is, the first set of bushings 180 and the second set of bushings 182 provide an isolating interface between the CT core halves 102 and 120 and the housings 110 and 128 to absorb mechanical tolerance between the housings and the CT 24 such that, when the CT 24 is clamped together in the closed position, the mating faces are kept parallel. The interface between the core halves 102 and 120 and the housings 110 and 128 via the first set of bushings 180 and the second set of bushings 182 also controls the force distribution on the mating faces. Both the parallel contact and mating force are factors that affect CT operation. By ensuring parallel contact and mating forces via the isolating interface, the CT 24 may more reliably provide current measurements and/or power harvesting from the power line. Additionally, the bushings 180 and 182 may absorb mechanical shock and vibration that could affect operation of the CT 24. The first and second sets of bushings 180 and 182 and the corresponding protrusions may be suspended in the housings via openings 190 that limit the movement between the respective core half 102 and 120 and the housing 110 and 128.

Figure 5:
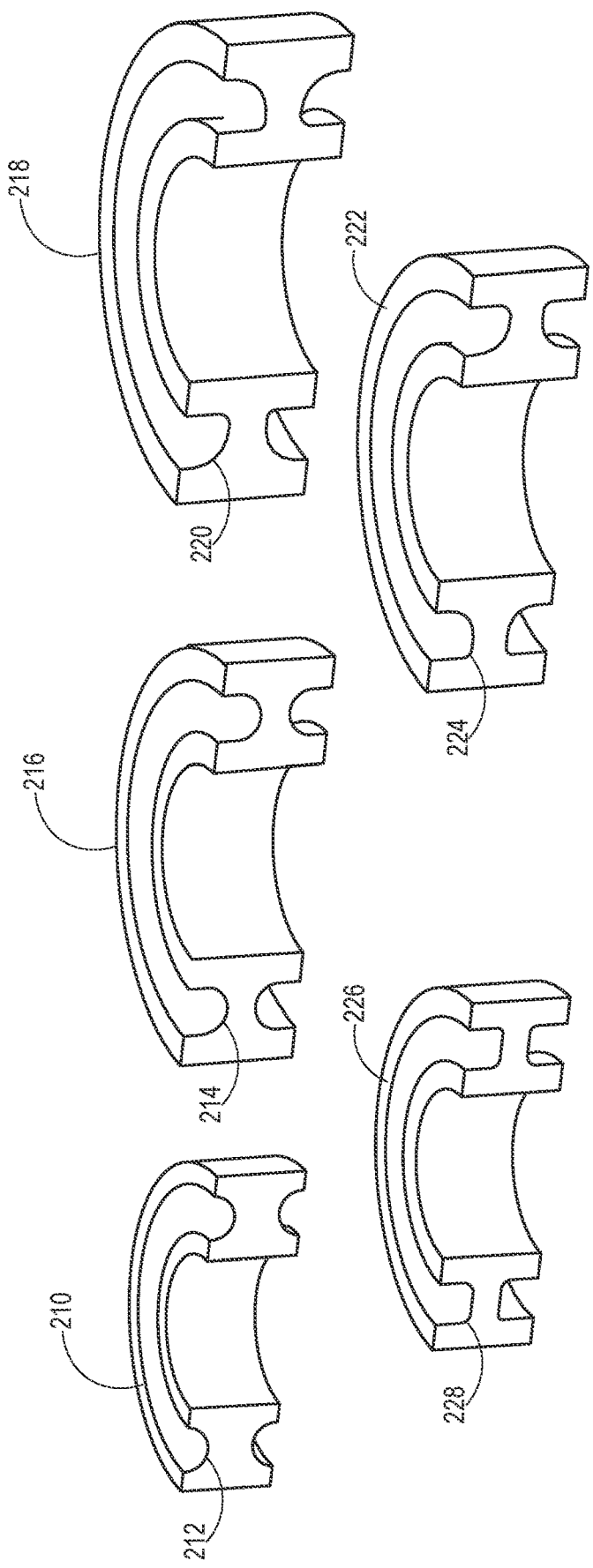
FIG. 5 is perspective view of various bushings that may be used to allow movement of the CT core half of FIG. 4 with respect to the housing the CT core half, in accordance with an embodiment.

FIG. 5 is a perspective view of different bushings with various structural shapes that may be used in the mounting suspension system of FIG. 3, in accordance with an embodiment. The structural shape of the bushing can be manipulated to achieve the desired interface in the mechanical mount. The shape can be made to have more stiffness in one direction and less stiffness in another. The shape and/or stiffness may allow rotation of the CT core half in certain directions while limiting rotation in another. Various combinations of different bushings may be used to achieve the parallel contact and ensure even force distribution on the mating faces of the CT.

As illustrated, a first bushing 210 has a shallow semicircular recess 212 along the longitudinal body of the bushing 210 to have more stiffness than a deeper circular recess 214 of a second bushing 216. A bushing 218 with a quarter-circular recess 220 along the longitudinal body of the bushing 218 may allow more flexing of the bushing 218 interior as compared to the interior. Conversely, a bushing 222 with a quarter-circular recess 224 along the longitudinal body of the bushing 222 may allow more flexing of the bushing 222 towards the exterior as compared to the interior. Further, a bushing 226 may have a semi-rectangular recess 228 that flexes approximately equally on both sides more than a semi-circular recess.

Additionally and/or alternatively, the material properties of the bushing can be used to control the isolating interface. The thermal properties can be varied to match the temperature range of the CT and absorb thermal expansion tolerances between the CT and housing. These material property manipulations may ensure the parallel contact and mating force distribution sufficient for the desired CT operation.

Figure 6:
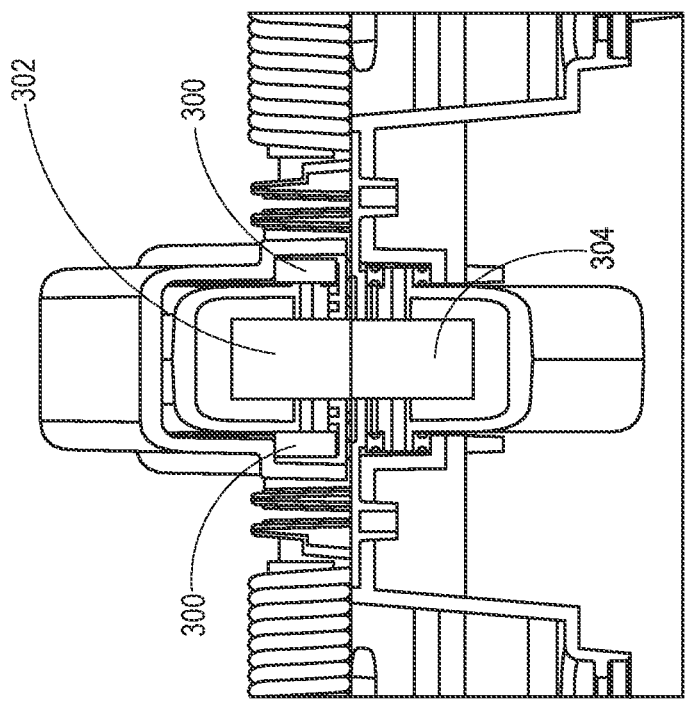
FIG. 6 is a cross-sectional rear view of the CT of FIG. 1, in accordance with an embodiment.

FIG. 6 is a cross-sectional rear view of the CT, in accordance with an embodiment. As illustrated, one of the CT core halves 302 and 304 may be tilted or misaligned with respect to the opposite CT core half in the closed position. To ensure alignment and parallel contact between the core halves 302 and 304, the bushing 300 may apply counter-forces on the housing of the CT core half that causes the CT core half to stay in contact, in parallel alignment, and with sufficient mating force for the faces of the CT core halves 302 and 304 to be connected for operation of the CT. That is, a tilt angle of a face 306 of a core half may be aligned parallel with a face 308 of the other core half at various angles due to flexing of the bushings 300.

Figure 7:
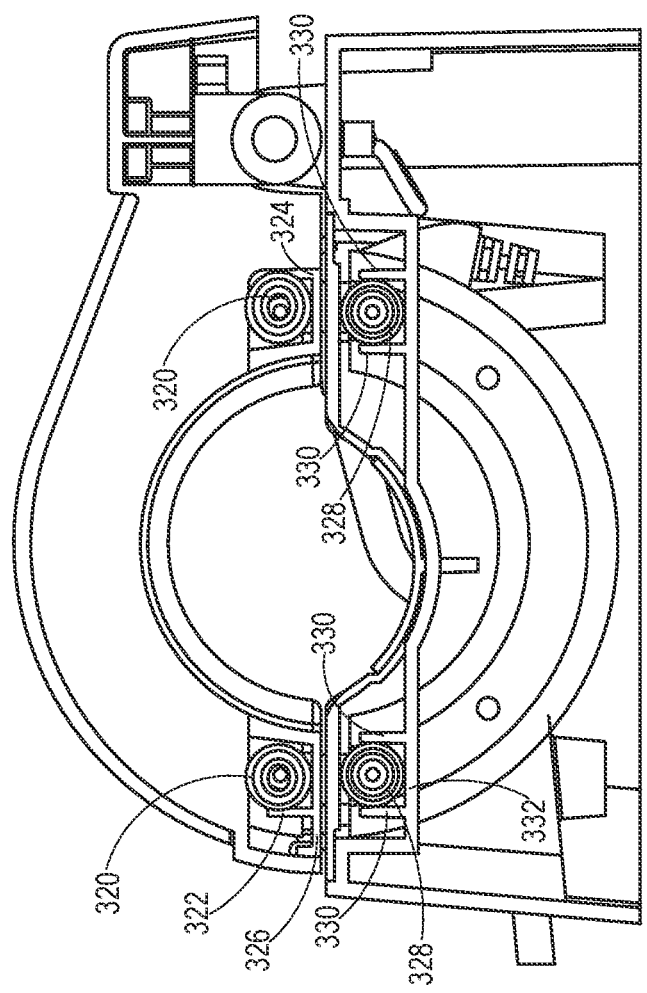
FIG. 7 is a cross-sectional side view of the CT of FIG. 1, in accordance with an embodiment.

FIG. 7 is a cross-sectional side view of a CT that uses bushings to ensure alignment of the faces of the CT core halves, in accordance with an embodiment. In the illustrated embodiment, a first set of bushings 320 may be secured by protrusions 322 and/or edges 324 of a first housing 326 and a second set of bushings 328 may be secured by protrusions 330 and/or edges of a second housing 332.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A split core current transformer (CT), comprising:
   a first CT core half comprising:
      a first magnetic core half;
      a first set of windings wrapped around the first magnetic core half; and
      a first insulative body over the first magnetic core half and the first set of windings;
   a first housing configured to house the first CT core half;
   a second CT core half comprising:
      a second magnetic core half;
      a second set of windings wrapped around the second magnetic core half; and
      a second insulative body over the second magnetic core half and the second set of windings;
   a second housing configured to house the second CT core half; and
   a first set of bushings configured to flexibly couple the first insulative body to the first housing and a second set of bushings configured to flexibly couple the second insulative body to the second housing, the first and second sets of bushings to maintain contact between faces of the first CT core half and faces of the second CT core half.

2. The split core CT of claim 1, wherein each bushing comprises an annular body with an opening, wherein the first insulative body comprises a first set of protrusions configured to engage the opening of each bushing to secure each bushing to the first CT core half.

3. The split core CT of claim 2, wherein the first insulative body is made of molded plastic via an overmold tool, wherein an overmold tool includes spaces to form the protrusions as part of the molded plastic of the first insulative body.

4. The split core CT of claim 1, wherein the first set of bushings are made of a different material than the second set of bushings coupled to the second CT core half that for allow different flexing of the first CT core half than the second CT core half.

5. The split core CT of claim 1, wherein a clamp spring applies a closing force on the upper half towards lower half to cause the core faces to contact each other.

6. The split core CT of claim 5, wherein bushings of the first set of bushings located closer to the clamp spring are designed with a different stiffness than the bushings of the second set of bushings located further from the closing clamp.

7. The split core CT of claim 5, wherein the first set of bushings maintain the core faces of the first CT core half parallel to faces of the second CT core half to ensure face alignment and force distribution that maximizes contact between the core faces and minimize gaps between the core faces.

8. The split core CT of claim 1, wherein the split core CT is configured to provide both current measurements and power harvesting.

9. The split core CT of claim 1, wherein the first set of bushings is configured to act as an isolating interface between the first CT core half and the first housing that allows the first CT core half to move with respect to the first housing by flexing of the first set of bushings.

10. A method, comprising:
overmolding a first insulative body on a first CT core half;
securing a first set of bushings to the first insulative body;
inserting the first CT core half into a first housing, wherein the first set of bushings acts as an isolating interface between the first CT core half and the first housing that allows the first CT core half to move with respect to the first housing to ensure that faces of the first CT core half maintain contact with corresponding faces of a second CT core half of the CT;
rotatably coupling the first housing to a second housing via a pin; and
biasing the first housing towards a closed position with respect to the second housing via a torsion spring, wherein the torsion spring applies a connecting force that causes the faces of the first CT core half to contact the faces of the second CT core half with sufficient contact that allows magnetic flux to flow throughout the CT core.

11. The method of claim 10, comprising:
overmolding the second insulative body on the second CT core half;
securing a second set of bushings to the second insulative body; and
inserting the second CT core half into a second housing, wherein the second set of bushings acts as an isolating interface between the second CT core half and the second housing that allows the second CT core half to move with respect to the second housing.

12. The method of claim 10, comprising securing the first set of bushings to the first insulative body by inserting an opening of each bushing onto a corresponding protrusion of the first insulative body.

13. The method of claim 12, comprising overmolding the corresponding protrusions of the first set of bushings using an overmold tool.

14. The method of claim 10, wherein the first set of bushings is suspended into corresponding openings of the first housing.

15. A current transformer (CT), comprising:
a first CT core half comprising:
a first magnetic core half;
a first set of windings wrapped around the first magnetic core half; and
a first insulative body over the first magnetic core half and the first set of windings;
a first housing configured to house the first CT core half;
a second CT core half; and
a first set of bushings configured to flexibly couple the first insulative body to the first housing to act as an isolating interface between the first CT core half and the first housing that allows the first CT core half to move with respect to the first housing, and a second set of bushings configured to flexibly couple a second insulative body to a second housing to act as an isolating interface between the second CT core half and the second housing that allows the second CT core half to move with respect to the second housing to ensure that faces of the first CT core half maintain contact with corresponding faces of the second CT core half.

16. The CT of claim 15, wherein the second CT core half comprises:
a second magnetic core half;
a second set of windings wrapped around the second magnetic core half; and
the second insulative body over the second magnetic core half and the second set of windings;
the second housing configured to house the second CT core half, wherein the second housing and the first housing are rotatably coupled to rotate between an open position in which a power line is allowed to be inserted in an opening between the first housing and the second housing and a closed position in which the faces of the first magnetic core half and the faces of the second magnetic core half contact each other to allow magnetic flux to flow throughout the first magnetic core half and the second magnetic core half.

17. The CT of claim 15, wherein the second CT core half comprises the second set of bushings configured to flexibly couple the second insulative body to the second housing, wherein the first set of bushings and second set of bushings allow for different flexible couplings of the first insulative body to the first housing and second insulative body to the second housing.

18. The CT of claim 15, wherein each bushing of the first set of bushings comprises an annular body with an opening, wherein the first insulative body comprises a first set of protrusions configured to engage the opening of each bushing to secure each bushing to the first CT core half.

19. The CT of claim 15, wherein the first insulative body is made of molded plastic via an overmold tool, wherein an overmold tool includes spaces to form the protrusions as part of the molded plastic on the first insulative body.

* * * * *